(12) United States Patent
Neal et al.

(10) Patent No.: US 10,461,011 B2
(45) Date of Patent: Oct. 29, 2019

(54) MICROELECTRONICS PACKAGE WITH AN INTEGRATED HEAT SPREADER HAVING INDENTATIONS

(71) Applicant: Intel Corporation, Santa Clara, CA (US)

(72) Inventors: Nicholas Neal, Gilbert, AZ (US); David W. Mendel, Sunnyvale, CA (US); Chandra M. Jha, Chandler, AZ (US); Kelly P. Lofgreen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/855,971

(22) Filed: Dec. 27, 2017

(65) Prior Publication Data

US 2019/0198416 A1  Jun. 27, 2019

(51) Int. Cl.
| | |
|---|---|
| *H01L 23/48* | (2006.01) |
| *H01L 23/367* | (2006.01) |
| *H01L 21/48* | (2006.01) |
| *H01L 23/373* | (2006.01) |
| *H01L 25/065* | (2006.01) |
| *H01L 25/00* | (2006.01) |

(52) U.S. Cl.
CPC ...... *H01L 23/3672* (2013.01); *H01L 21/4871* (2013.01); *H01L 23/3675* (2013.01); *H01L 23/3737* (2013.01); *H01L 25/0655* (2013.01); *H01L 25/50* (2013.01)

(58) Field of Classification Search
CPC .................. H01L 23/3675; H01L 25/0655
See application file for complete search history.

(56) References Cited

U.S. PATENT DOCUMENTS

| | | |
|---|---|---|
| 2005/0068739 A1 | 3/2005 | Arvelo et al. |
| 2006/0038281 A1* | 2/2006 | Colgan ............... H01L 25/0655 257/706 |
| 2006/0170094 A1* | 8/2006 | Subramanian ...... H01L 23/3675 257/706 |
| 2008/0242002 A1 | 10/2008 | Colgan et al. |
| 2014/0239482 A1* | 8/2014 | Kourakata .......... H01L 23/3677 257/712 |
| 2017/0148767 A1 | 5/2017 | Hung et al. |

OTHER PUBLICATIONS

"German Application Serial No. 102018129873.0, Office Action dated Jun. 27, 2019", w English Translation, 13 pgs.

* cited by examiner

*Primary Examiner* — Ermias T Woldegeorgis
(74) *Attorney, Agent, or Firm* — Schwegman Lundberg & Woessner, P.A.

(57) ABSTRACT

Described herein are microelectronics packages and methods for manufacturing the same. The microelectronics package may include a first die, a second die, and an integrated heat spreader. The integrated heat spreader may include a first surface. The first surface may define a first indentation located in between the first die and the second die.

25 Claims, 6 Drawing Sheets

MICROELECTRONICS PACKAGE WITH AN INTEGRATED HEAT SPREADER HAVING INDENTATIONS

TECHNICAL FIELD

Embodiments described generally herein relate to microelectronic packages and microelectronic packages manufacturing. Some embodiments relate to using an integrated heat spreader to control heat transfer from a first die to a second die.

BACKGROUND

A microelectronics package may include a plurality of die. During operations, the plurality of die may generate heat. The heat generated needs to be removed to prevent the plurality of die from overheating.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Multi-die packages often have a primary die that may be located proximate one or more smaller secondary dies. The primary die may have a high total power (e.g., >200 W) but a low power density (e.g., <15 W/cm$^2$). The secondary dies may have a low total power (e.g. >20 W) but a high power density (e.g. >150 W/cm^2). The high power from the primary, or large, die may cause high integrated heat spreader (IHS) temperatures, although the low power density may mean that the maximum junction temperature, $T_{jmax}$, of the large die is still relatively low. The low power of the small dies may have a relatively small effect on the IHS temperature. However, the heat from the primary die may spread to the region of the IHS covering the secondary, or small, dies causing the temperature of the surface to which the small dies needs to conduct heat to rise. Also, the small dies' high power density may also increases its junction temperature, $T_j$. Often, the secondary dies also have lower $T_{jmax}$ limits than the larger die. All of these effects combine to create a thermal dilemma on the secondary dies that is due in large part to the spreading of heat from the large, or primary, die to the secondary dies.

In the past, one approach to solving this problem has been to try to improve the cooling solution on the package by implementing liquid cooling or refrigeration. However, many customers would prefer to use air-cooled solutions, and often a small die with high power density is not very sensitive to increasing the heat transfer coefficient of the cooling solution, because the small die has a spreading problem, not a power removal problem.

As disclosed herein, physical control of the heat spreading in the IHS may be controlled through the design of the IHS itself. By utilizing indentations, such as narrow slits, channels, groves, etc. between die cut in specific ways, heat spreading in the region of the IHS covering one die may be limited onto another die. Stated another way, small, low-power dies may be isolated from other high-power die on a package using indentations in the IHS. The indentations may be used to isolate one die from another die, one die from a group of dies, and/or a group of dies from another group of dies. In addition, the indentations may be the same or different depending on the thermal performance of the dies and the desired thermal isolation.

Figure 1:
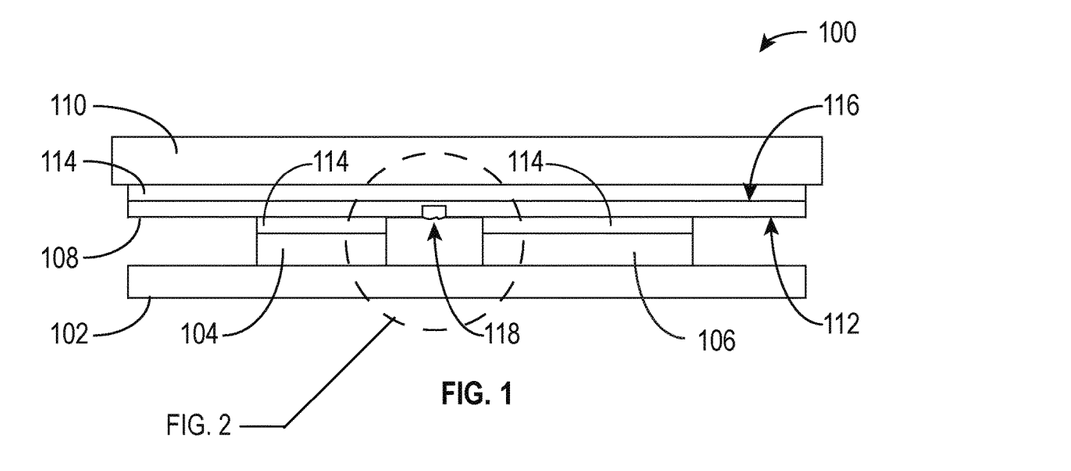
FIG. 1 illustrates a side view of a microelectronics package in accordance with embodiments disclosed herein.

Turning now to the figures, FIG. 1 illustrates a side view of a microelectronics package 100 in accordance with embodiments disclosed herein. The microelectronics package 100 may include a substrate 102, a first die 104, a second die 106, an integrated heat spreader 108, and a heat sink 110. The first die 104 and the second die 106 may be attached to the substrate 102. The integrated heat spreader 108 may thermally couple the first die 104 to the second die 106. For example, each of the first die 104 and the second die 106 may be attached to a first surface 112 of the integrated heat spreader 108, thus allowing thermal conduction between the first die 104 and the second die 106. In addition, a thermal grease 112, or other material to facilitate heat transfer from the first die 104 and the second die 106 to the integrated heat spreader 108 may be applied as shown in FIG. 1. The heat sink 110 may be attached to a second surface 116 of the integrated heat spreader 108. The thermal grease 114 may also be used to promote heat transfer from the integrated heat spreader 108 to the heat sink 110.

The first surface 112 of the integrated heat spreader 108 may define an indentation 118. As disclosed herein, the indentation 118 may help to thermally isolate the first die 104 from the second die 106. For example, the indentation 118 may increase a thermal resistance between the first die 104 and the second die 106, and thus decrease heat transfer from the first dies 104 to the second die 106.

Figure 2:
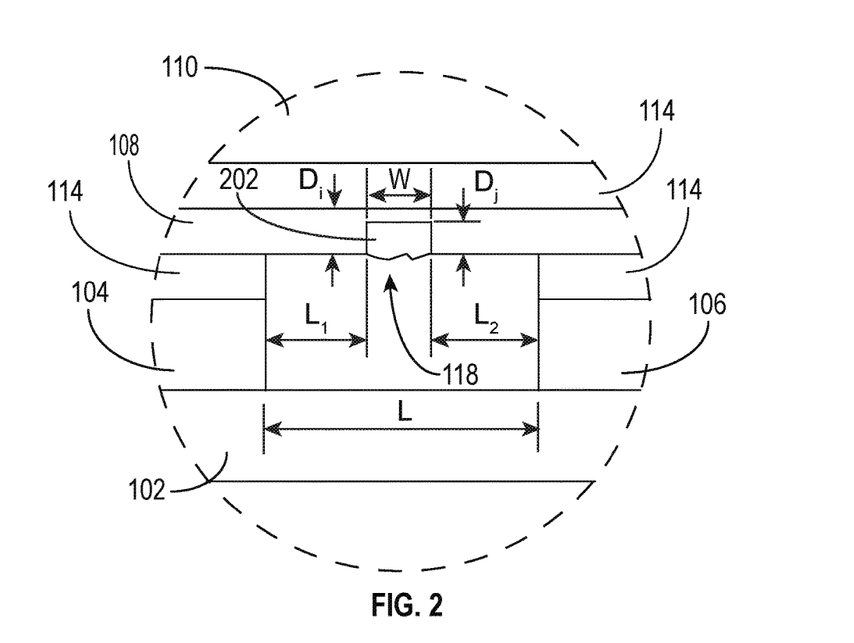
FIG. 2 illustrates a detail of an indentation in accordance with embodiments disclosed herein.

FIG. 2 illustrates the indentation 118 in accordance with embodiments disclosed herein. As shown in FIG. 2, the indentation 118 may have a width, W, and a depth, $D_j$. The integrated heat spreader 108 may have a thickness, $D_i$. The spacing between the first die 104 and the second die 106 may be a length, L.

The indentation 118 may include a filler 202. As disclosed herein the filler 202 may be used to adjust a resistance to heat transfer between the first die 104 and the second die 106. For example, the thermal conductivity of the filler 202 may be lower than the thermal conductivity of the integrated heat spreader 108. For instance, the thermal conductivity of the filler 202 may be one or more orders of magnitude smaller than the thermal conductivity of the integrated heat spreader 108. In addition, the thermal conductivity of the filler 202 may less than the thermal conductivity of air.

Figure 3A:
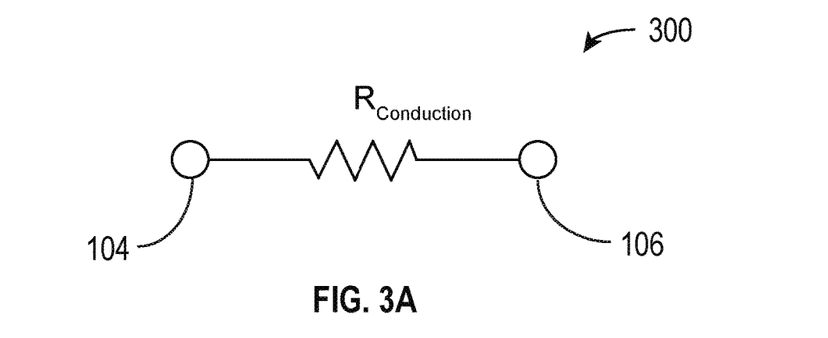
FIGS. 3A and 3B illustrate schematics of a thermal circuit analog in accordance with embodiments disclosed herein.
Figure 3B:
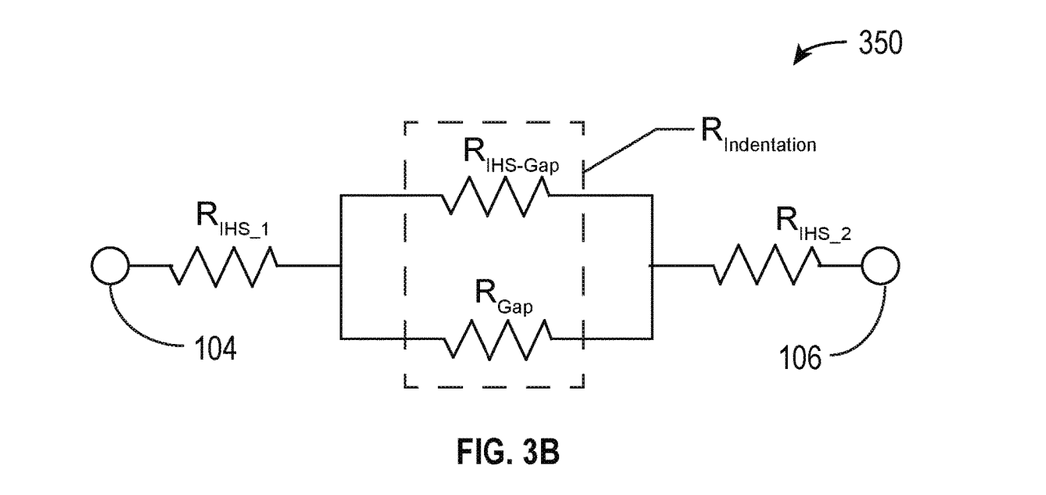

FIGS. 3A and 3B illustrate schematics of thermal circuit analogs 300 and 350 in accordance with embodiments disclosed herein. The thermal circuit analog 300 shown in FIG. 3A illustrates the situation in which the indentation 118 is missing from the integrated heat spreader 108. As shown in FIG. 3A, the integrated heat spreader 108 provides the only resistance, $R_{Conduction}$, between the first die 104 and the second die 106, where:

$$R_{Conduction} = \frac{L}{kA} \qquad \text{Eqn. 1}$$

and L is the distance between the first die 104 and the second die 106 shown in FIG. 2, k is the thermal conductivity of the integrated heat spreader 108, and A is the cross-sectional area of the integrated heat spreader 108, which is a function of $D_i$ shown in FIG. 2. As seen in Eqn. 1, the heat transfer rate, or the resistance to heat transfer, between the first die 104 and the second die 106 may be adjusted by three parameters, L, k, and $D_i$. However, L and $D_i$ are physically constrained in that as the microelectronics package 100 gets smaller there is less space in the z-direction for a thicker integrated heat spreader 108 and the x-y plane to space the first die 104 from the second die 106. Thus, the material in which the integrated heat spreader 108 is made is the main mechanism in which to control the heat transfer rate, or resistance to heat transfer, between the first die 104 and the second die 106. Given the purpose of the integrated heat spreader 108 is to conduct heat from the first die 104 and the second die 106, large k values are desired, which drive the resistance to heat transfer to lower.

The thermal circuit analog 350 shown in FIG. 3B illustrates the situation in which the indentation 118 is present in the integrated heat spreader 108 as shown in FIG. 2. As shown in FIG. 3B, a portion of the integrated heat spreader 108 and the indentation 118 provide resistance:

$$R_{Total} = R_{IHS\_1} + R_{Indentation} + R_{IHS\_2} \qquad \text{Eqn. 2}$$

$$R_{Total} = \frac{L_1}{k_i D_i} + \left[\frac{1}{R_{IHS\text{-}Gap}} + \frac{1}{R_{Gap}}\right]^{-1} = \frac{L_2}{k_i D_i} \qquad \text{Eqn. 3}$$

$$R_{Total} = \frac{L_1}{k_i D_i} + \left[\frac{1}{\frac{W}{k_i(D_i - D_j)}} + \frac{1}{\frac{W}{k_j(D_j)}}\right]^{-1} + \frac{L_2}{k_i D_i} \qquad \text{Eqn. 4}$$

$$R_{Total} = \frac{L_1}{k_i D_i} + \left[\frac{k_i(D_i - D_j)}{W} + \frac{k_j(D_j)}{W}\right]^{-1} + \frac{L_2}{k_i D_i} \qquad \text{Eqn. 5}$$

$$R_{Total} = \frac{L_1}{k_i D_i} + \frac{W}{k_i(D_i - D_j) + k_j D_j} + \frac{L_2}{k_i D_i} \qquad \text{Eqn. 6}$$

where W is the width of the indentation 118, $k_i$ is the thermal conductivity of the integrated heat spreader 108, $k_j$ is the thermal conductivity of the material within the indentation, $D_i$ is the thickness of the integrated heat spreader 108 adjacent the indentation 118, and $D_j$ is the depth of the indentation 118, $L_1$ is the distance from the first die 104 to the indentation 118, and $L_2$ is the distance from the second die 106 to the indentation.

As shown in Eqn. 6, the total resistance of heat transfer from the first die 104 to the second die 106 can be manipulated in several ways. For example, the depth of the indentation 118, $D_j$, may be manipulated, thus changing both the cross-sectional area of indentation 118 and the amount of the integrated heat spreader 108 adjacent the indentation 118. In addition, the width of the indentation 118, W, also may be adjusted to achieve a desired total resistance. Furthermore, the thermal conductivity of the material in the indentation may also be manipulated to achieve the desired total resistance.

For example, a filler 120, such as an epoxy, may be used to manipulate the resistance within the indentation 118. Moreover, the location of the indentation 118 with respect to the first die 104 and the second die 106 can be manipulated. For example, the distance between the first die 104 and the indentation 118 (i.e., $L_1$) may be manipulated to increase or decrease the heat transfer resistance between the first die 104 and the indentation 118.

Figure 4A:
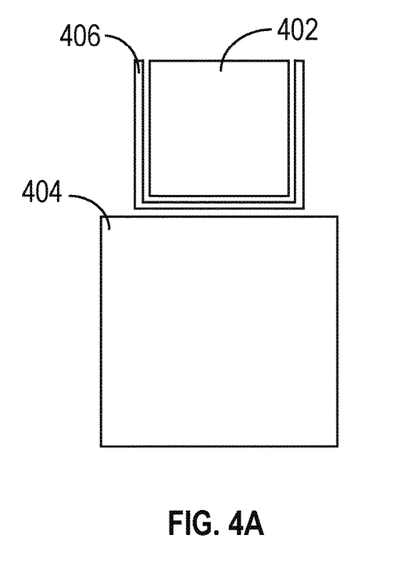
FIGS. 4A-4C illustrate indentation configurations in accordance with embodiments disclosed herein.

The above discussion with respect to FIGS. 1-3B have assumed a single indentation that passes between two dies on a single side of each die and that the indentation has a rectangular profile. However, as shown in FIG. 4A, a first die 402 and a second die 404 may be separated by an indentation 406. The indentation 406 may surround a portion of the first die 402 or the second die 404.

Figure 4B:
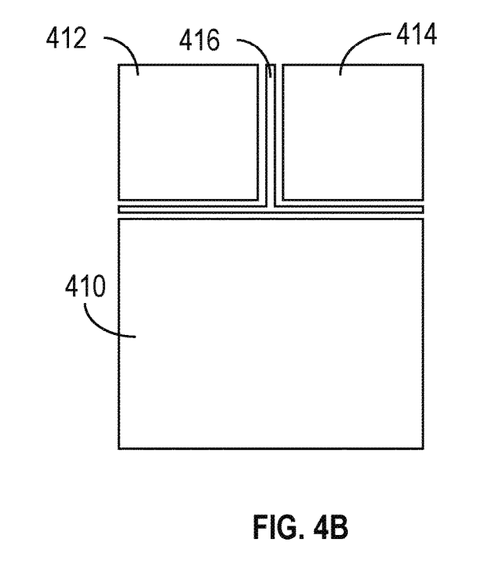

FIG. 4B shows an indentation configuration in accordance with embodiments disclosed herein. As shown in FIG. 4B, a first die 410 may be separated from a second die 412 and a third die 414 by a continuous indentation 416. The continuous indentation 416 also may separate the second die 412 from the third die 414.

Figure 4C:
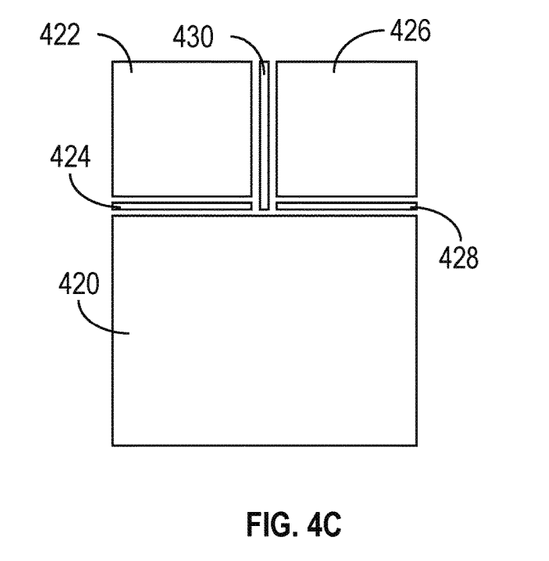

FIG. 4C shows an indentation configuration in accordance with embodiments disclosed herein. As shown in FIG. 4C, a first die 420 may be separated from a second die 422 by a first indentation 424. The first die 420 also may be separated from a third die 426 by a second indentation 428. A third indentation 430 may separate the second die 422 from the third die 426.

The thermal analog shown in FIG. 3B may be applied to each portion of an indentation located in between two respective dies. Thus, the heat transfer resistance between any two respective dies may be manipulated as disclosed herein by adjusting the parameters of the indentation and thus, the parameters of Eqn. 6. For example, the third indentation 430 may be equally spaced from the second die 422 and the third die 426 and the first indentation 424 and the second indentation 428 may be spaced closer to the second die 422 and the third die 426 than to the first die 420.

Figure 5A:
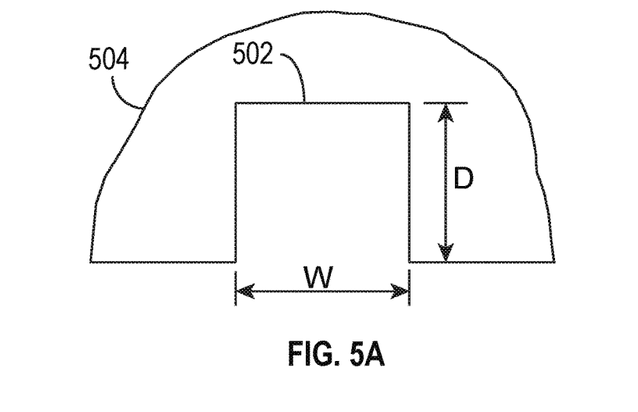
FIGS. 5A, 5B, and 5C illustrate indentation profiles in accordance with embodiments disclosed herein.
Figure 5B:
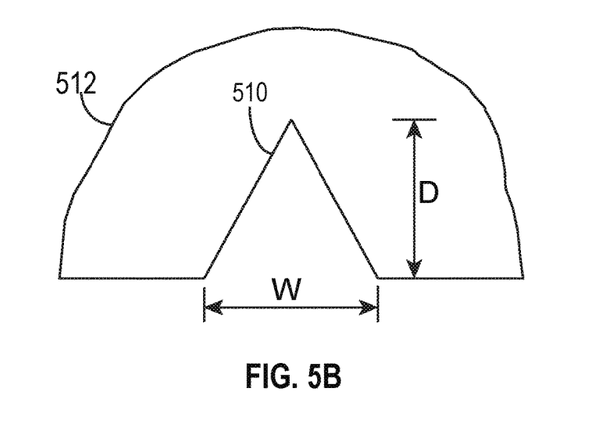
Figure 5C:
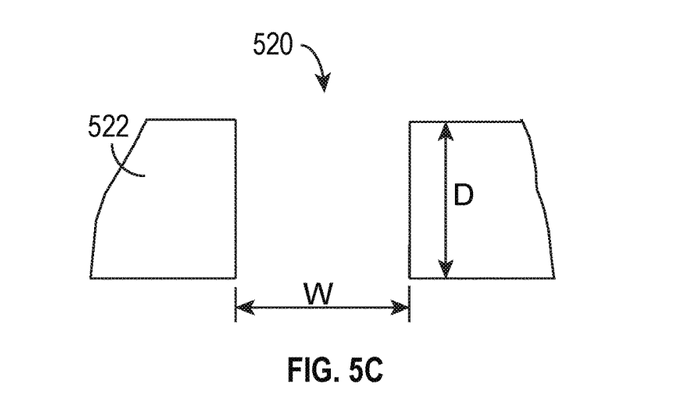

The various indentations disclosed herein may have uniform profiles. For example, as shown in FIG. 5A, an indentation 502 formed in an integrated heat spreader 504 may have a rectangular profile with a depth, D, and width, W. The rectangular profile may be formed by traditional milling operations. As shown in FIG. 5B, an indentation 510 formed in an integrated heat spreader 512 may have a triangular profile with a depth, d, and width, W. The triangular profile may be formed by single-thread bit machining. The depth of the profiles may be expressed as a function of a thickness of the integrated heat spreader. For example, the depth of the indentations disclosed herein may have a depth that is about 80% to about 95% of the thickness of the integrated heat spreader. FIG. 5C shows a special case where an indentation 520 that passes completely through an integrated heat spreader 522. A thermal analog for the case shown in FIG. 5C may be:

$$R_{Total} = R_{IHS\_1} + R_{Gap} + R_{IHS\_2} \qquad \text{Eqn. 7}$$

$$R_{Total} = \frac{L_1}{k_i D_i} + \frac{W}{k_j(D_j)} + \frac{L_2}{k_i D_i} \qquad \text{Eqn. 8}$$

where $k_j$ is the thermal conductivity of air, D is thickness of the integrated heat spreader 522, and W is the width of the gap between sections of the integrated heat spreader 522. The thermal analogs disclosed herein include only conduction as a mode of heat transfer. In view of the present disclosure, one skilled in the art would understand that convection and radiation modes of heat transfer could included in the thermal analog models.

The various indentations disclosed herein also may have non-uniform profiles. For example, the first indentation 424 and the second indentation 428 may have a rectangular profile and the third indentation 430 may have a triangular profile. In addition, the dimensions of an indentation may vary. For example, the portion of indentation 416 located in between the second die 412 and the third die 414 may have a first width and a first depth. The portion of the indentation 416 located adjacent the first die 410 may have a second width and a second depth. The first width and/or the first depth may be smaller and/or larger than the second width and/or the second depth depending on thermal conditions. Stated another way, the profile of the various indentations disclosed herein may vary in order to better control heat transfer from one die to another.

Figure 6:
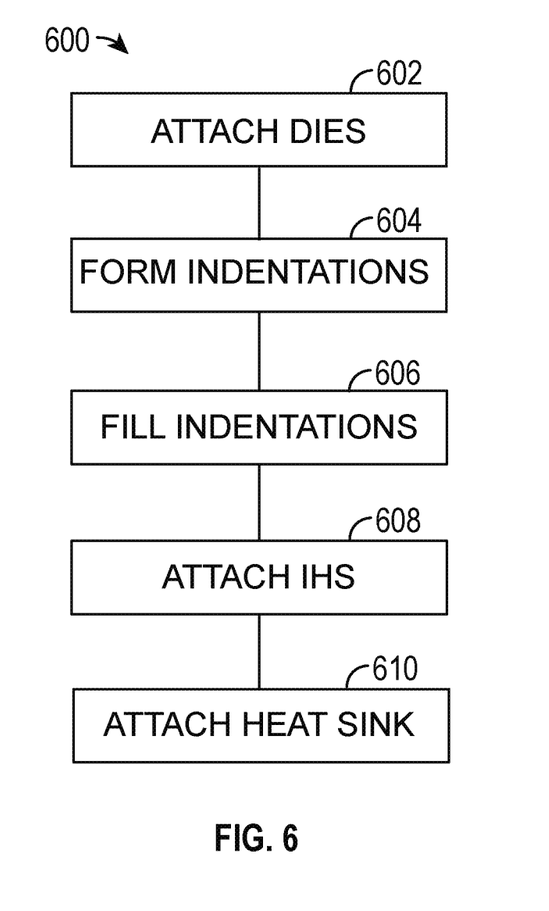
FIG. 6 illustrates an example method for manufacturing a microelectronics package in accordance with embodiments disclosed herein.

FIG. 6 illustrates an example method 600 flow for manufacturing a microelectronics package in accordance with embodiment disclosed herein. The method 600 may begin at stage 602 where one or more dies may be attached to a substrate. For example, as disclosed herein, a first die, a second die, and a third die may be attached to a substrate.

From stage 602, the method 600 may proceed to stage 604 where one or more indentation may be formed in an integrated heat spreader. For instance, as disclosed herein, a first indentation, a second indentation, and a third indentation may be formed in a first surface of an integrated heat spreader. The indentations may be formed such that they are located in between the various dies attached to the substrate. In addition, the indentations may be form with uniform or non-uniform profiles, triangular or rectangular profiles, etc. as disclosed herein. Furthermore, indentations may be form such that there are indentations between some dies and not others. For instance, the third indentation 430 shown in FIG. 4C may be omitted. Stated another way, the first indentation 424 and the second indentation 428 may separate the first die 420 from the second die 422 and the third die 426, while the second die 422 is not separated from the third die 426 by an indentation.

From stage 604, the method 600 may proceed to stage 606 where a filler may be applied to the indentations. For example, a filler with a low thermal conductivity may be applied to the indentations so as to fill the indentation. As disclosed herein, the filler can be selected to achieved a desired heat transfer rate, or resistance to heat transfer, for a given thermal environment.

From stage 606, the method 600 may proceed to stage 608 where the integrated heat spreader may be attached to the dies. For example, the integrated heat spreader may be attached to the dies such that each of the indentations is located in between two or more dies so as to create a heat transfer resistance between dies as disclosed herein.

From stage 608, the method 600 may proceed to stage 610 where heat sink may be attached to a second surface of the integrated heat spreader. The heat sink may be used to further extract heat from the plurality of dies.

While the various stages of the method 600 have been described in one order, the various stages of the method 600 may be performed in various orders without departing from the spirit of this disclosure. For example, the integrated heat spreader may be attached to the heat sink before it is attached to the dies. In addition, the integrated heat spreader may be attached to the dies before the indentations are formed in it.

The microelectronics packages disclosed herein assist with thermal management. Without the integrated heat spreader, a high bandwidth memory die may have severe thermal issues. By utilizing indentations as disclosed herein, the temperature of the integrated heat spreader over the high bandwidth memory die may be reduced, resulting in a de facto reduction in the $T_j$ of the high bandwidth memory die as well. The benefit may be realizable for packages with large and small die-die spacing. As disclosed herein, carefully tuning the shape of the indentations improves the thermal isolation of the target die while minimizing heating of the large die. The use of indentations as disclosed herein also may be scaled to HVM levels of production using traditional milling, single-thread bit machining, sinker EDM, laser cutting, etc.

Some of the embodiments disclosed herein have been validated through simulation results. Detailed thermal modeling was performed on a package with a large central die next to a smaller, low power high bandwidth memory die with high power density. The cooling solution in the simulation was tuned such that the fabric die was near, but not exceeding its $T_{jmax}$. In this case, the high bandwidth memory die is severely thermally limited. However, implementing an integrated heat spreader reduces the high bandwidth memory die's maximum temperature by more than 5 degrees, bringing it within its workable thermal limits, while the increase in temperature on the main die does not push it over its own limit.

Figure 7:
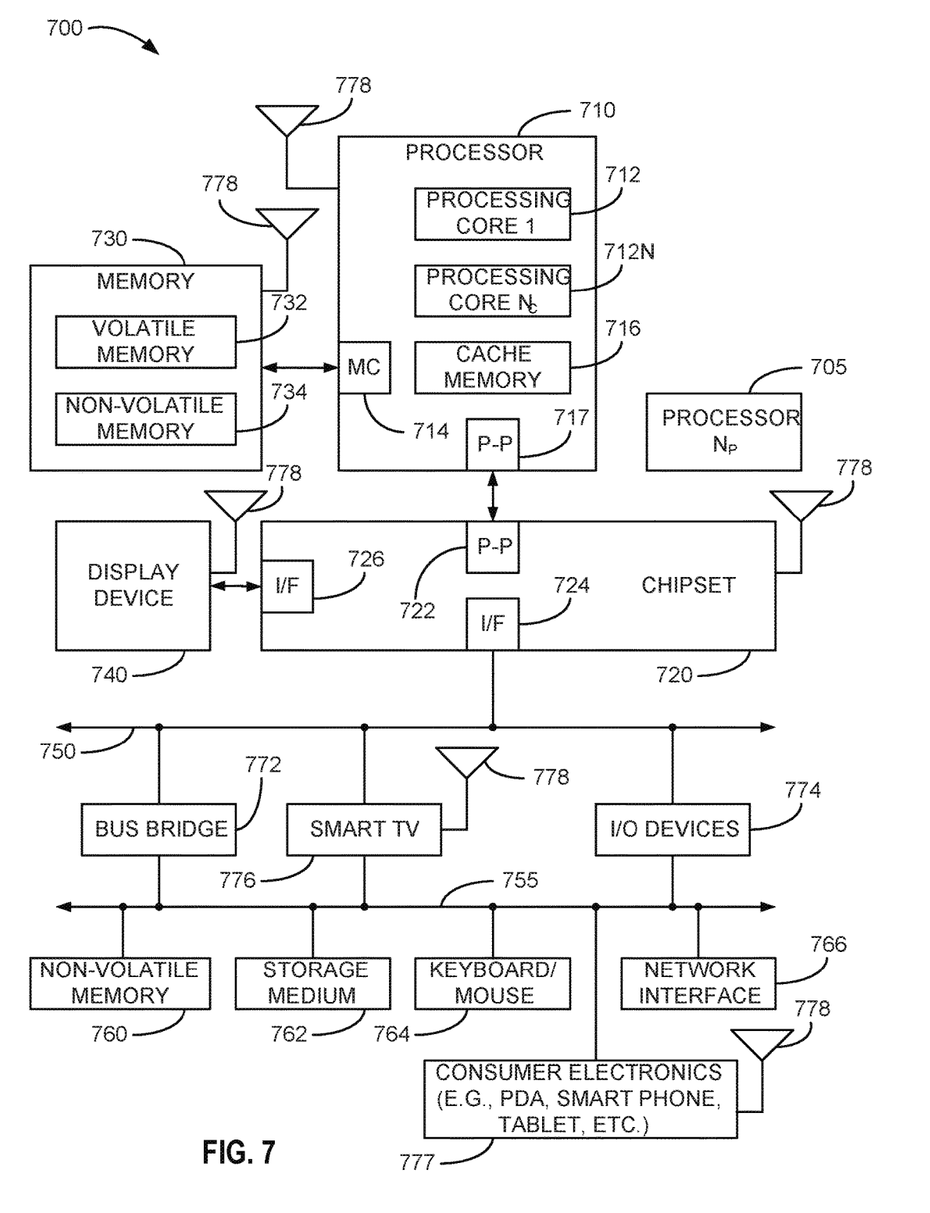
FIG. 7 illustrates an example schematic of a computing device in accordance with embodiments disclosed herein.

FIG. 7 illustrates a system level diagram, according to one embodiment of the invention. For instance, FIG. 7 depicts an example of an electronic device (e.g., system) including the microelectronics package 100. FIG. 7 is included to show an example of a higher level device application for the present invention. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, and a network interface 766 via interface 724 and/or 704, smart TV 776, consumer electronics 777, etc.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

ADDITIONAL NOTES & EXAMPLES

Example 1 is a microelectronics package comprising: a first die; a second die; and an integrated heat spreader, the integrated heat spreader including a first surface, the first surface defining a first indentation located in between the first die and the second die.

In Example 2, the subject matter of Example 1 optionally includes wherein the first indentation has a rectangular profile.

In Example 3, the subject matter of any one or more of Examples 1-2 optionally include wherein the first indentation has a triangular profile.

In Example 4, the subject matter of any one or more of Examples 1-3 optionally include wherein the first indentation has a non-uniform profile.

In Example 5, the subject matter of any one or more of Examples 1-4 optionally include a filler located within the first indentation.

In Example 6, the subject matter of Example 5 optionally includes wherein the filler has a thermal conductivity at least one order of magnitude less than a thermal conductivity of the integrated heat spreader.

In Example 7, the subject matter of any one or more of Examples 1-6 optionally include wherein the first indentation at least partially surrounds the first die or the second die.

In Example 8, the subject matter of any one or more of Examples 1-7 optionally include % of the thickness.

In Example 9, the subject matter of any one or more of Examples 1-8 optionally include wherein the first die has a first power density and the second die has a second power density, the first power density being at least one order of magnitude less than the second power density.

In Example 10, the subject matter of any one or more of Examples 1-9 optionally include wherein the first die is a primary die and the second die is a high bandwidth memory die.

In Example 11, the subject matter of any one or more of Examples 1-10 optionally include a third die, the integrated heat spreader further defining a second indentation located in between the first die and the third die.

In Example 12, the subject matter of Example 11 optionally includes wherein the first indentation and the second indentation each has a similar profile.

In Example 13, the subject matter of any one or more of Examples 11-12 optionally include wherein the first indentation and the second indentation each has a different profile.

In Example 14, the subject matter of any one or more of Examples 11-13 optionally include wherein the integrated heat spreader further defines a third indentation located in between the second die and the third die.

In Example 15, the subject matter of Example 14 optionally includes wherein the first, second, and third indentations each has a similar profile.

In Example 16, the subject matter of any one or more of Examples 14-15 optionally include wherein the first, second, and third indentations each has a different profile.

In Example 17, the subject matter of any one or more of Examples 1-16 optionally include a third die, the integrated heat spreader further defining a second indentation locate in between the third die and the first die and the second die.

In Example 18, the subject matter of Example 17 optionally includes wherein the first indentation and the second indentation each has a similar profile.

In Example 19, the subject matter of any one or more of Examples 17-18 optionally include wherein the first indentation and the second indentation each has a different profile.

In Example 20, the subject matter of any one or more of Examples 1-19 optionally include a heat sink attached to a second surface of the integrated heat spreader.

In Example 21, the subject matter of any one or more of Examples 1-20 optionally include wherein the first indentation thermally isolates the first die from the second die.

Example 22 is a method of manufacturing a microelectronics package, the method comprising: attaching a first die and a second die to a substrate; forming a first indentation in a first surface of an integrated heat spreader; and attaching the integrated heat spreader to the first die and the second die such that the first indentation is located in between the first die and the second die.

In Example 23, the subject matter of Example 22 optionally includes wherein forming the first indentation includes forming the first indentation to have a rectangular profile.

In Example 24, the subject matter of any one or more of Examples 22-23 optionally include wherein forming the first indentation includes forming the first indentation to have a triangular profile.

In Example 25, the subject matter of any one or more of Examples 22-24 optionally include wherein forming the first indentation includes forming the first indentation to have a non-uniform profile.

In Example 26, the subject matter of any one or more of Examples 22-25 optionally include applying a filler within the first indentation.

In Example 27, the subject matter of Example 26 optionally includes wherein the filler has a thermal conductivity at least one order of magnitude less than a thermal conductivity of the integrated heat spreader.

In Example 28, the subject matter of any one or more of Examples 22-27 optionally include wherein forming the first indentation includes forming the first indentation such that when the integrated heat spreader is attached to the first die and the second die, the first indentation at least partially surrounds the first die or the second die.

In Example 29, the subject matter of any one or more of Examples 22-28 optionally include % of the thickness.

In Example 30, the subject matter of any one or more of Examples 22-29 optionally include attaching a third die to the substrate; forming a second a second indentation in the integrated heat spreader; and attaching the integrated heat spreader to the third die such that such that the second indentation is located in between the first die and the third die.

In Example 31, the subject matter of Example 30 optionally includes wherein forming the first indentation and the second indentation includes forming the first indentation and the second indentation such that each has a similar profile.

In Example 32, the subject matter of any one or more of Examples 30-31 optionally include wherein forming the first indentation and the second indentation includes forming the first indentation and the second indentation such that each has a different profile.

In Example 33, the subject matter of any one or more of Examples 30-32 optionally include forming a third indentation in the integrated heat spreader such that when the integrated heat spreader is attached to the first, second, and third die the third indentation is located in between the second die and the third die.

In Example 34, the subject matter of Example 33 optionally includes wherein forming the first, second, and third indentations includes forming the first, second, and third indentations such that each has a similar profile.

In Example 35, the subject matter of any one or more of Examples 33-34 optionally include wherein forming the first, second, and third indentations includes forming the first, second, and third, indentations such that each has a different profile.

In Example 36, the subject matter of any one or more of Examples 22-35 optionally include attaching a third die to the substrate; forming a second indentation in the integrated heat spreader; and attaching the integrated heat spreader to the third die such that the second indentation is located in between the third die and the first die and the second die.

In Example 37, the subject matter of Example 36 optionally includes wherein forming the first indentation and the second indentation includes forming the first indentation and the second indentation such that each has a similar profile.

In Example 38, the subject matter of any one or more of Examples 36-37 optionally include wherein forming the first indentation and the second indentation forming the first indentation and the second indentation such that each has a different profile.

In Example 39, the subject matter of any one or more of Examples 22-38 optionally include attaching a heat sink to a second surface of the integrated heat spreader.

Example 40 is a method of manufacturing a microelectronics package, the method comprising: attaching a first die and a second die to a substrate; attaching an integrated heat spreader to the first die and the second die; and forming a first indentation in a first surface of the integrated heat spreader in between the first die and the second die.

In Example 41, the subject matter of Example 40 optionally includes wherein forming the first indentation includes forming the first indentation to have a rectangular profile.

In Example 42, the subject matter of any one or more of Examples 40-41 optionally include wherein forming the first indentation includes forming the first indentation to have a triangular profile.

In Example 43, the subject matter of any one or more of Examples 40-42 optionally include wherein forming the first indentation includes forming the first indentation to have a non-uniform profile.

In Example 44, the subject matter of any one or more of Examples 40-43 optionally include applying a filler within the first indentation.

In Example 45, the subject matter of Example 44 optionally includes wherein the filler has a thermal conductivity at least one order of magnitude less than a thermal conductivity of the integrated heat spreader.

In Example 46, the subject matter of any one or more of Examples 40-45 optionally include wherein forming the first indentation includes forming the first indentation to at least partially surround the first die or the second die.

In Example 47, the subject matter of any one or more of Examples 40-46 optionally include 0/% of the thickness.

In Example 48, the subject matter of any one or more of Examples 40-47 optionally include attaching a third die to the substrate; attaching the integrated heat spreader to the third die; and forming a second indentation in the first surface of the integrated heat spreader in between the first die and the third die.

In Example 49, the subject matter of Example 48 optionally includes wherein forming the first indentation and the second indentation includes forming the first indentation and the second indentation such that each has a similar profile.

In Example 50, the subject matter of any one or more of Examples 48-49 optionally include wherein forming the first indentation and the second indentation includes forming the first indentation and the second indentation such that each has a different profile.

In Example 51, the subject matter of any one or more of Examples 48-50 optionally include forming a third indentation in the integrated heat spreader in between the second die and the third die.

In Example 52, the subject matter of Example 51 optionally includes wherein forming the first, second, and third indentations includes forming the first, second, and third indentations such that each has a similar profile.

In Example 53, the subject matter of any one or more of Examples 51-52 optionally include wherein forming the first, second, and third indentations includes forming the first, second, and third, indentations such that each has a different profile.

In Example 54, the subject matter of any one or more of Examples 40-53 optionally include attaching a third die to the substrate; attaching the integrated heat spreader to the third die; and forming a second indentation in the first surface of the integrated heat spreader in between the third die and the first die and the second die.

In Example 55, the subject matter of Example 54 optionally includes wherein forming the first indentation and the second indentation includes forming the first indentation and the second indentation such that each has a similar profile.

In Example 56, the subject matter of any one or more of Examples 54-55 optionally include wherein forming the first indentation and the second indentation forming the first indentation and the second indentation such that each has a different profile.

In Example 57, the subject matter of any one or more of Examples 40-56 optionally include attaching a heat sink to a second surface of the integrated heat spreader.

Example 58 is a microelectronics package comprising: a plurality of dies attached to a substrate; an integrated heat spreader, the integrated heat spreader defining at least one indentation arranged so as to pass in between at least a subset of the plurality of dies.

In Example 59, the subject matter of Example 58 optionally includes a filler located within the at least one indentation.

In Example 60, the subject matter of Example 59 optionally includes wherein the filler has a thermal conductivity at least one order of magnitude less than a thermal conductivity of the integrated heat spreader.

In Example 61, the subject matter of any one or more of Examples 58-60 optionally include wherein at least one of the plurality of dies is at least partially surrounded by the at least one indentation.

In Example 62, the subject matter of any one or more of Examples 58-61 optionally include a heat sink attached to the integrated heat spreader.

In Example 63, the subject matter of any one or more of Examples 1-62 optionally include wherein the microelectronics package is a component of a computing device.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A microelectronics package comprising:
   a first die;
   a second die;
   a third die; and
   an integrated heat spreader, the integrated heat spreader including a first surface, the first surface defining:
      a first indentation located in between the first die and the second die, and
      a second indentation located in between the third die and the first die and the second die.

2. The microelectronics package of claim 1, further comprising a filler located within the first indentation.

3. The microelectronics package of claim 2, wherein the filler has a thermal conductivity at least one order of magnitude less than a thermal conductivity of the integrated heat spreader.

4. The microelectronics package of claim 1, wherein the first indentation at least partially surrounds the first die or the second die.

5. The microelectronics package of claim 1, wherein the integrate heat spreader has a thickness and the first indentation has a depth of about 80% to about 95% of the thickness.

6. The microelectronics package of claim 1, wherein the first die has a first power density and the second die has a second power density, the first power density being at least one order of magnitude less than the second power density.

7. The microelectronics package of claim 1, wherein the first indentation and the second indentation each has a similar profile.

8. The microelectronics package of claim 1, further comprising a heat sink attached to a second surface of the integrated heat spreader.

9. The microelectronics package of claim 1, wherein the first indentation thermally isolates the first die from the second die.

10. The microelectronics package of claim 1, wherein the first indentation has a non-uniform profile.

11. The microelectronics package of claim 1, wherein the first die is a primary die and the second die is a high bandwidth memory die.

12. The microelectronics package of claim 1, wherein the first indentation and the second indentation each has a different profile.

13. A method of manufacturing a microelectronics package, the method comprising:
    attaching a first die, a second die, and a third die to a substrate;
    forming a first indentation in a first surface of an integrated heat spreader;
    forming a second indentation in the integrated heat spreader; and
    attaching the integrated heat spreader to the first die, the second die, and the third die such that:
        the first indentation is located in between the first die and the second die, and
        the second indentation is located in between the third die and the first die and the second die.

14. The method of claim 13, further comprising applying a filler within the first indentation.

15. The method of claim 13, wherein forming the first indentation includes forming the first indentation such that when the integrated heat spreader is attached to the first die and the second die, the first indentation at least partially surrounds the first die or the second die.

16. The method of claim 13, further comprising attaching a heat sink to a second surface of the integrated heat spreader.

17. A microelectronics package comprising: a first die; a second die; a third die; and an integrated heat spreader, the integrated heat spreader including a first surface, the first surface defining:
    a first indentation located in between the first die and the second die, a second indentation located in between the first die and the third die, and a third indentation located in between the second die and the third die.

18. The microelectronics package of claim 17, wherein the first indentation and the second indentation each has a similar profile.

19. The microelectronics package of claim 17, wherein the first indentation at least partially surrounds the first die or the second die.

20. The microelectronics package of claim 17, wherein the first indentation has a non-uniform profile.

21. The microelectronics package of claim 17, wherein the first die is a primary die and the second die is a high bandwidth memory die.

22. The microelectronics package of claim 17, wherein the first indentation and the second indentation each has a different profile.

23. A method of manufacturing a microelectronics package, the method comprising:
    attaching a first die, a second die, and a third die to a substrate; forming a first indentation in a first surface of an integrated heat spreader; forming a second indentation and a third indentation in the integrated heat spreader; and attaching the integrated heat spreader to the first die, the second die, and the third die such that:
    the first indentation is located in between the first die and the second die, the second indentation is located in between the first die and the third die, and the third indentation is located in between the second die and the third die.

24. The method of claim 23, further comprising applying a filler within the first indentation.

25. The method of claim 23, wherein forming the first indentation includes forming the first indentation such that when the integrated heat spreader is attached to the first die and the second die, the first indentation at least partially surrounds the first die or the second die.

* * * * *

UNITED STATES PATENT AND TRADEMARK OFFICE
CERTIFICATE OF CORRECTION

PATENT NO. : 10,461,011 B2
APPLICATION NO. : 15/855971
DATED : October 29, 2019
INVENTOR(S) : Neal et al.

Page 1 of 1

It is certified that error appears in the above-identified patent and that said Letters Patent is hereby corrected as shown below:

In Column 14, Line 6, in Claim 17, after "comprising:", insert --¶--

In Column 14, Line 6, in Claim 17, after "die;", insert --¶--

In Column 14, Line 7, in Claim 17, after "die;", insert --¶--

In Column 14, Line 7, in Claim 17, after "and", insert --¶--

In Column 14, Line 31, in Claim 23, after "substrate;", insert --¶--

In Column 14, Line 32, in Claim 23, after "spreader;", insert --¶--

In Column 14, Line 34, in Claim 23, after "and", insert --¶--

Signed and Sealed this
Twenty-third Day of June, 2020

Andrei Iancu
*Director of the United States Patent and Trademark Office*